United States Patent
Shibayama et al.

(10) Patent No.: US 8,604,412 B2
(45) Date of Patent: Dec. 10, 2013

(54) SPECTRAL MODULE AND METHOD FOR MANUFACTURING SPECTRAL MODULE

(75) Inventors: Katsumi Shibayama, Hamamatsu (JP); Takashi Kasahara, Hamamatsu (JP); Anna Yoshida, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 364 days.

(21) Appl. No.: 12/992,473

(22) PCT Filed: May 7, 2009

(86) PCT No.: PCT/JP2009/058639
§ 371 (c)(1),
(2), (4) Date: Dec. 14, 2010

(87) PCT Pub. No.: WO2009/139322
PCT Pub. Date: Nov. 19, 2009

(65) Prior Publication Data
US 2011/0075143 A1    Mar. 31, 2011

(30) Foreign Application Priority Data

May 15, 2008 (JP) ............... P2008-128687
Dec. 5, 2008  (JP) ............... P2008-311087

(51) Int. Cl.
*G01J 3/50*    (2006.01)
*G01J 3/12*    (2006.01)

(52) U.S. Cl.
USPC ........................ 250/226; 356/328

(58) Field of Classification Search
USPC ............... 250/226; 356/310, 219, 326, 328
See application file for complete search history.

(56) References Cited

U.S. PATENT DOCUMENTS

| 4,259,014 A | 3/1981 | Talmi |
| 4,644,632 A | 2/1987 | Mächler et al. |

(Continued)

FOREIGN PATENT DOCUMENTS

| DE | 197 17 015 | 10/1998 |
| FR | 2 847 978 | 6/2004 |

(Continued)

OTHER PUBLICATIONS

Helmut W. Teichmann et al., "Replizierter mikro-optischer Sensor für die industrielle Spektralsensorik," tm-Technisches Messen, vol. 68, No. 5, May 2001, pp. 200-203, with partial English translation.

(Continued)

*Primary Examiner* — Thanh Luu
(74) *Attorney, Agent, or Firm* — Drinker Biddle & Reath LLP

(57) ABSTRACT

The present invention provides a highly reliable spectral module. When light L1 proceeding to a spectroscopic unit (4) passes through a light transmitting hole (50) in the spectral module (1) in accordance with the present invention, only the light having passed through a light entrance side unit (51) formed such as to become narrower toward a substrate (2) and entered a light exit side unit (52) formed such as to oppose a bottom face (51b) of the light entrance side unit (51) is emitted from a light exit opening (52a). Therefore, stray light M incident on a side face (51c) or bottom face (51b) of the light entrance side unit (51) is reflected to the side opposite to the light exit side unit (52) and thus is inhibited from entering the light exit side unit (52). Therefore, the reliability of the spectral module (1) can be improved.

4 Claims, 12 Drawing Sheets

(56) References Cited

U.S. PATENT DOCUMENTS

| | | | |
|---|---|---|---|
| 5,995,221 A | 11/1999 | Slutter et al. | |
| 6,081,331 A | 6/2000 | Teichmann | |
| 6,249,346 B1 | 6/2001 | Chen et al. | |
| 6,303,934 B1 | 10/2001 | Daly et al. | |
| 6,538,736 B1 | 3/2003 | Palumbo | |
| 6,608,679 B1 | 8/2003 | Chen et al. | |
| 6,859,274 B2 | 2/2005 | Inamoto | |
| 7,170,600 B2 | 1/2007 | Nishii et al. | |
| 7,283,233 B1 | 10/2007 | Ho et al. | |
| 7,576,855 B2 * | 8/2009 | Tsukuda | 356/326 |
| 7,623,235 B2 | 11/2009 | Ho et al. | |
| 7,697,137 B2 | 4/2010 | Comstock, II | |
| 7,864,317 B2 | 1/2011 | Bockstaele et al. | |
| 7,916,292 B2 | 3/2011 | Konno et al. | |
| 8,040,507 B2 | 10/2011 | Shibayama | |
| 8,045,158 B2 | 10/2011 | Shibayama | |
| 8,068,223 B2 | 11/2011 | Suzuki et al. | |
| 8,092,737 B2 | 1/2012 | Chang et al. | |
| 8,351,032 B2 | 1/2013 | Grueger et al. | |
| 2002/0060792 A1 | 5/2002 | Ibsen et al. | |
| 2003/0197862 A1 | 10/2003 | Cohen et al. | |
| 2004/0196458 A1 | 10/2004 | Shimizu et al. | |
| 2004/0239931 A1 | 12/2004 | Teichmann et al. | |
| 2005/0230844 A1 | 10/2005 | Kinsman | |
| 2006/0023212 A1 | 2/2006 | Nishii et al. | |
| 2006/0268269 A1 | 11/2006 | Warren | |
| 2008/0123095 A1 | 5/2008 | Hubner et al. | |
| 2008/0225291 A1 | 9/2008 | Konno et al. | |
| 2008/0231852 A1 | 9/2008 | Shih et al. | |
| 2009/0284741 A1 | 11/2009 | Shibayama et al. | |
| 2009/0284742 A1 | 11/2009 | Shibayama | |
| 2009/0284743 A1 | 11/2009 | Shibayama | |
| 2009/0290154 A1 | 11/2009 | Shibayama et al. | |
| 2009/0290155 A1 | 11/2009 | Shibayama et al. | |
| 2009/0290164 A1 | 11/2009 | Shibayama et al. | |
| 2010/0277730 A1 | 11/2010 | Kimura et al. | |
| 2010/0277731 A1 | 11/2010 | Teramura et al. | |
| 2010/0284084 A1 | 11/2010 | Ishibe | |
| 2010/0315633 A1 | 12/2010 | Shibayama et al. | |
| 2010/0315634 A1 | 12/2010 | Shibayama | |
| 2011/0026022 A1 | 2/2011 | Takizawa et al. | |
| 2011/0128541 A1 | 6/2011 | Grueger et al. | |
| 2011/0141469 A1 | 6/2011 | Shibayama | |
| 2013/0038874 A1 | 2/2013 | Shibayama et al. | |

FOREIGN PATENT DOCUMENTS

| | | |
|---|---|---|
| JP | 04-287001 | 10/1992 |
| JP | 4-294223 | 10/1992 |
| JP | 6-167637 | 6/1994 |
| JP | 08-145794 | 6/1996 |
| JP | 2592081 | 1/1999 |
| JP | 2000-065642 | 3/2000 |
| JP | 2000-269472 | 9/2000 |
| JP | 2000-298066 | 10/2000 |
| JP | 2003-139611 | 5/2003 |
| JP | 2003-202463 | 7/2003 |
| JP | 2003-243444 | 8/2003 |
| JP | 2004-053992 | 2/2004 |
| JP | 2004-191246 | 7/2004 |
| JP | 2004-309146 | 11/2004 |
| JP | 2004-354176 | 12/2004 |
| JP | 2004-537750 | 12/2004 |
| JP | 2005-308495 | 11/2005 |
| JP | 2006-030031 | 2/2006 |
| JP | 2006-032561 | 2/2006 |
| JP | 2006-098428 | 4/2006 |
| JP | 2007-199540 | 8/2007 |
| JP | 2008-098367 | 4/2008 |
| WO | WO 99/29103 | 6/1999 |
| WO | WO 2004/082023 | 9/2004 |
| WO | WO 2008/029852 | 3/2008 |
| WO | 2008/149940 | 12/2008 |
| WO | WO 2008/149939 | 12/2008 |
| WO | WO 2008/149944 | 12/2008 |
| WO | WO 2009/139321 | 11/2009 |
| WO | WO 2009/139326 | 11/2009 |
| WO | WO 2009/139327 | 11/2009 |

OTHER PUBLICATIONS

Combining MEMS technology with image sensor technology Newly developed "thumb sized" ultra-compact spectroscope Started shipping samples of MS series "C10988MA(X)", News Release, Hamamatsu Photonics K.K., URL, https://jp.hamamatsu.com/hamamatsu/press/2008/common/pdf/200_08_28.pdf, Aug. 28, 2008, p. 1-p. 4 (with attached partial English-language translation).
U.S. Appl. No. 12/992,398, filed Feb. 10, 2011, Shibayama.
U.S. Appl. No. 12/992,428, filed Feb. 23, 2011, Shibayama.
U.S. Appl. No. 12/992,445, filed Feb. 2, 2011, Shibayama.
U.S. Appl. No. 12/992,412, filed Feb. 28, 2011, Shibayama.
U.S. Appl. No. 12/992,469, filed Feb. 8, 2011, Shibayama.
U.S. Office Action dated Sep. 18, 2013 that issued in U.S. Appl. No. 13/964,472 including Double Patenting Rejections on pp. 2-3.

* cited by examiner

SPECTRAL MODULE AND METHOD FOR MANUFACTURING SPECTRAL MODULE

TECHNICAL FIELD

The present invention relates to a spectral module for spectrally resolving and detecting light and a method for manufacturing the same.

BACKGROUND ART

As conventional spectral modules, those described in Patent Literatures 1 to 3 have been known, for example. Patent Literature 1 discloses a spectral module comprising a support which transmits light therethrough, an entrance slit for letting the light enter the support, a concave diffraction grating which spectrally resolves and reflects the light having entered the support, and a diode for detecting the light spectrally resolved and reflected by the concave diffraction grating.

CITATION LIST

Patent Literature

Patent Literature 1: Japanese Patent Application Laid-Open No. 4-294223
Patent Literature 2: Japanese Patent Application Laid-Open No. 2000-65642
Patent Literature 3: Japanese Patent Application Laid-Open No. 2004-354176

SUMMARY OF INVENTION

Technical Problem

In the spectral module disclosed in Patent Literature 1, however, the light having entered from the entrance slit may become stray light scattering within the support, thereby lowering the reliability of the spectral module.

In view of such circumstances, it is an object of the present invention to provide a highly reliable spectral module and a method for manufacturing the spectral module.

Solution to Problem

For achieving the above-mentioned object, the spectral module in accordance with the present invention comprises a main unit for transmitting light therethrough; a spectroscopic unit for spectrally resolving light having entered the main unit from a predetermined surface side of the main unit and reflecting the light toward the predetermined surface; and a photodetector, arranged on the predetermined surface, for detecting the light spectrally resolved by the spectroscopic unit; wherein the photodetector has a substrate unit formed with a light transmitting hole for transmitting therethrough light proceeding to the spectroscopic unit; wherein the light transmitting hole includes a light entrance side unit defining a light entrance opening and a light exit side unit defining a light exit opening; wherein the light entrance side unit is formed such as to have a bottom face substantially parallel to the predetermined surface and become narrower toward the predetermined surface; and wherein the light exit side unit is formed such as to have a side face substantially perpendicular to the predetermined surface and oppose the bottom face.

When the light proceeding to the spectroscopic unit passes through the light transmitting hole in this spectral module, only the light having entered the light exit side unit formed such as to oppose the bottom face of the light entrance side unit becoming narrower toward the predetermined surface of the main unit is emitted from the light exit opening. Here, the light incident on the side face or bottom face of the light entrance side unit is reflected to the opposite side of the light exit side unit, whereby stray light can be inhibited from entering the light exit side unit. This can improve the reliability of the spectral module.

Preferably, in the spectral module in accordance with the present invention, a light absorbing layer for absorbing light is formed between the photodetector and the predetermined surface, the light absorbing layer has a light transmitting slit for transmitting therethrough light proceeding to the spectroscopic unit through the light transmitting hole, and the light transmitting slit has a width smaller than the minimal width of the light exit side unit in a direction substantially orthogonal to an extending direction of a grating groove formed in the spectroscopic unit.

The resolution of the spectral module is greatly influenced by the minimal width of the slit in a direction substantially orthogonal to the extending direction of the grating groove. Therefore, making the width of the light transmitting slit smaller than the minimum width of the light transmitting hole in a direction substantially orthogonal to the extending direction of the grating groove can improve the resolution of the spectral module. This is advantageous in improving the reliability of the spectral module.

Preferably, in the spectral module in accordance with the present invention, the substrate unit is made of a crystalline material, while a side face of the light entrance side unit is formed along a (111) crystal plane. Forming the substrate unit made of a crystalline material such as Si with a side face along the (111) crystal plane of the material by wet etching or the like can accurately produce the light entrance side unit, which makes it possible to form the light transmitting hole with high precision, thereby improving the reliability of the spectral module.

The method for manufacturing a spectral module in accordance with the present invention is a method for manufacturing a spectral module comprising a main unit for transmitting light therethrough, a spectroscopic unit for spectrally resolving light having entered the main unit from a predetermined surface side of the main unit and reflecting the light toward the predetermined surface, and a photodetector for detecting the light spectrally resolved by the spectroscopic unit; the method comprising a photodetector preparation step of preparing the photodetector having a substrate unit formed with a light transmitting hole; and an arrangement step of arranging the photodetector prepared in the photodetector and the spectroscopic unit onto the main unit; wherein the photodetector preparation step includes a light entrance side unit formation step of carrying out wet etching from one main face side of the substrate unit so as to form a light entrance side unit for defining a light entrance opening of the light transmitting hole such that the light entrance side unit has a bottom face substantially parallel to the one main face and becomes narrower toward the other main face, and a light exit side unit formation step of carrying out dry etching from the other main face side of the substrate unit after the light entrance side unit formation step so as to form a light exit side unit for defining a light exit opening of the light transmitting hole such that the light exit side unit has a side face substantially perpendicular to the one main face and opposes the bottom face.

When forming the substrate unit with the light transmitting hole, the method for manufacturing a spectral module in accordance with the present invention carries out wet etching from one main face side of the substrate unit, so as to form a light entrance side unit for defining a light entrance opening, and then dry etching from the other main face side of the substrate unit, so as to form a light exit side unit for defining a light exit opening. Thus forming the light entrance side unit by wet etching can reduce the time and cost of the photodetector preparation step. Accurately forming the light exit side unit by dry etching can produce the light transmitting hole having a stable light transmitting characteristic, thereby improving the reliability of the spectral module.

Advantageous Effects of Invention

The present invention can provide a highly reliable spectral module.

DESCRIPTION OF EMBODIMENTS

Figure 1:
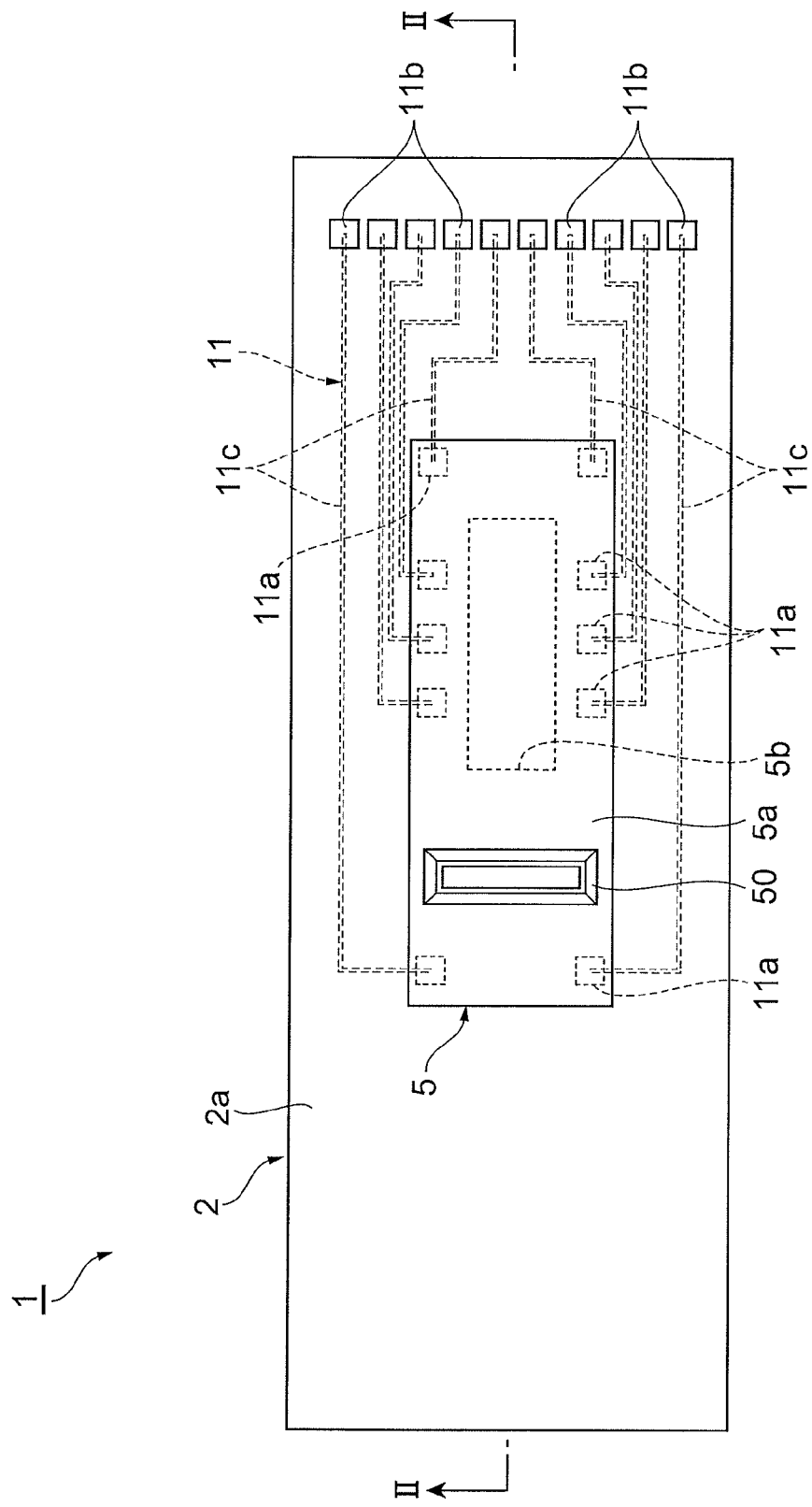
FIG. 1 is a plan view of the spectral module in accordance with an embodiment of the present invention.

In the following, preferred embodiments of the present invention will be explained in detail with reference to the drawings. In the drawings, the same or equivalent parts will be referred to with the same signs while omitting their overlapping descriptions.

First Embodiment

Figure 2:
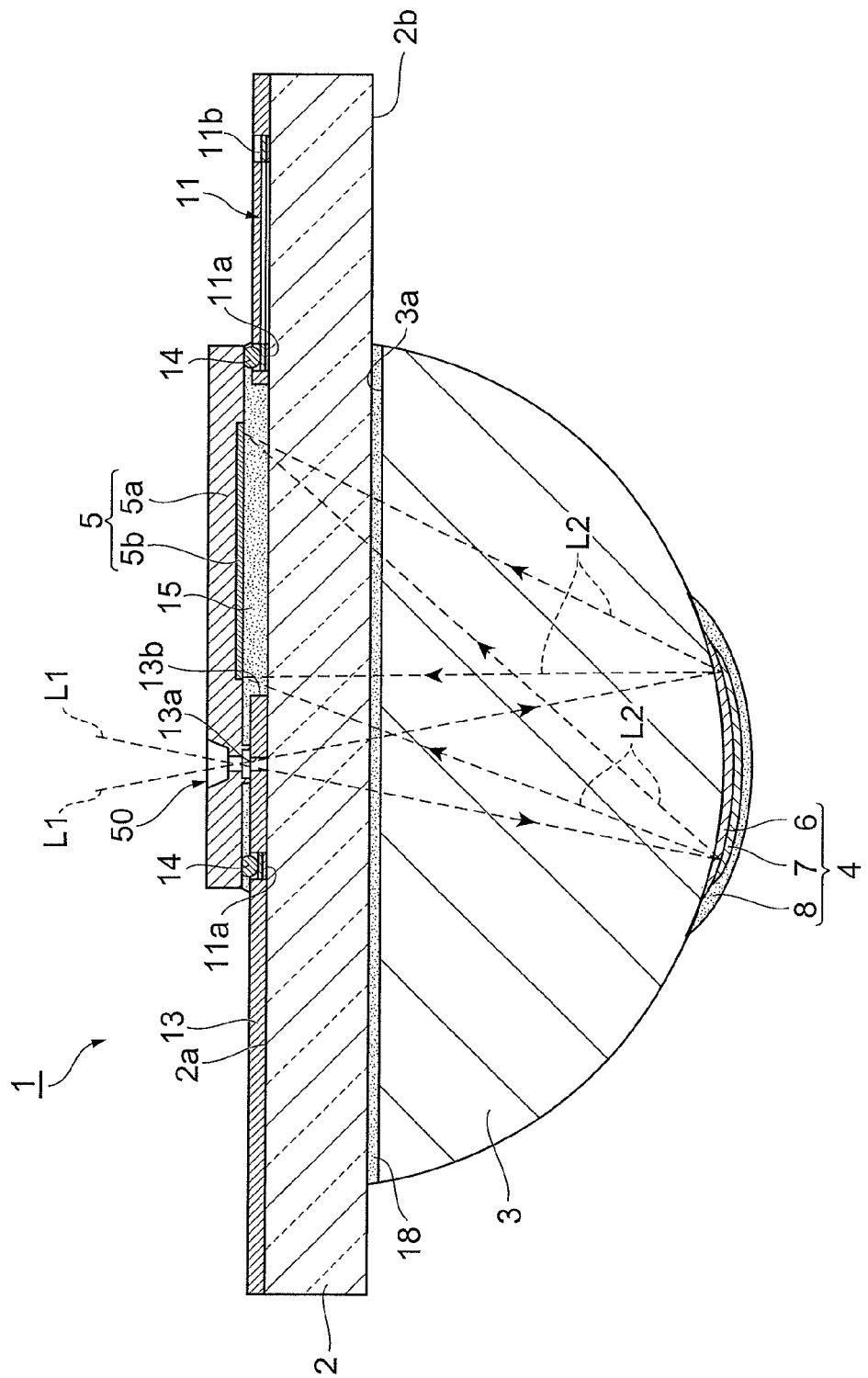
FIG. 2 is a sectional view taken along the line II-II illustrated in FIG. 1.

As illustrated in FIGS. 1 and 2, a spectral module 1 comprises a substrate (main unit) 2 which transmits therethrough light L1 entering from a front face (predetermined surface) 2a, a lens unit (main unit) 3 which transmits therethrough the light L1 entering from an entrance surface 3a after passing through the substrate 2, a spectroscopic unit 4 for spectrally resolving and reflecting the light L1 having entered the lens unit 3, and a photodetector 5 for detecting light L2 spectrally resolved by the spectroscopic unit 4. The spectral module 1 is a micro spectral module which spectrally resolves the light L1 with the spectroscopic unit 4 into the light L2 corresponding to a plurality of wavelengths and detects the light L2 with the photodetector 5, thereby measuring a wavelength distribution of the light L1 and the intensity of a specific wavelength component.

The substrate 2 is formed into a rectangular plate (e.g., having a full length of 15 to 20 mm, a full width of 11 to 12 mm, and a thickness of 1 to 3 mm) from any of light transmitting glass materials such as BK7, Pyrex (registered trademark), and silica, plastics, and the like. The front face 2a of the substrate 2 is formed with wiring 11 made of a monolayer film of Al, Au, or the like or a multilayer film of Cr—Pt—Au, Ti—Pt—Au, Ti—Ni—Au, Cr—Au, or the like. The wiring 11 has a plurality of pad units 11a arranged at a center portion of the substrate 2, a plurality of pad units 11b arranged at one longitudinal end portion of the substrate 2, and a plurality of connection units 11c for connecting the corresponding pad units 11a, 11b to each other. On the front face 2a side of the substrate 2, the wiring 11 has an antireflection layer made of a monolayer film of CrO or the like or a multilayer film of Cr—CrO or the like.

A light absorbing layer 13 formed on the front face 2a of the substrate 2 has a slit (light transmitting slit) 13a which transmits therethrough the light L1 proceeding to the spectroscopic unit 4 through a light transmitting hole 50 (which will be explained later) of the photodetector 5 and an opening 13b through which the light L2 proceeding to a light detection unit 5b (which will be explained later) of the photodetector 5 passes. Examples of materials for the light absorbing layer 13 include black resists, color resins (e.g., silicone, epoxy, acrylic, urethane, polyimide, and composite resins) containing fillers (e.g., carbon and oxides), metals and metal oxides of Cr, Co, and the like, their multilayer films, and porous ceramics and metals and metal oxides.

Figure 3:
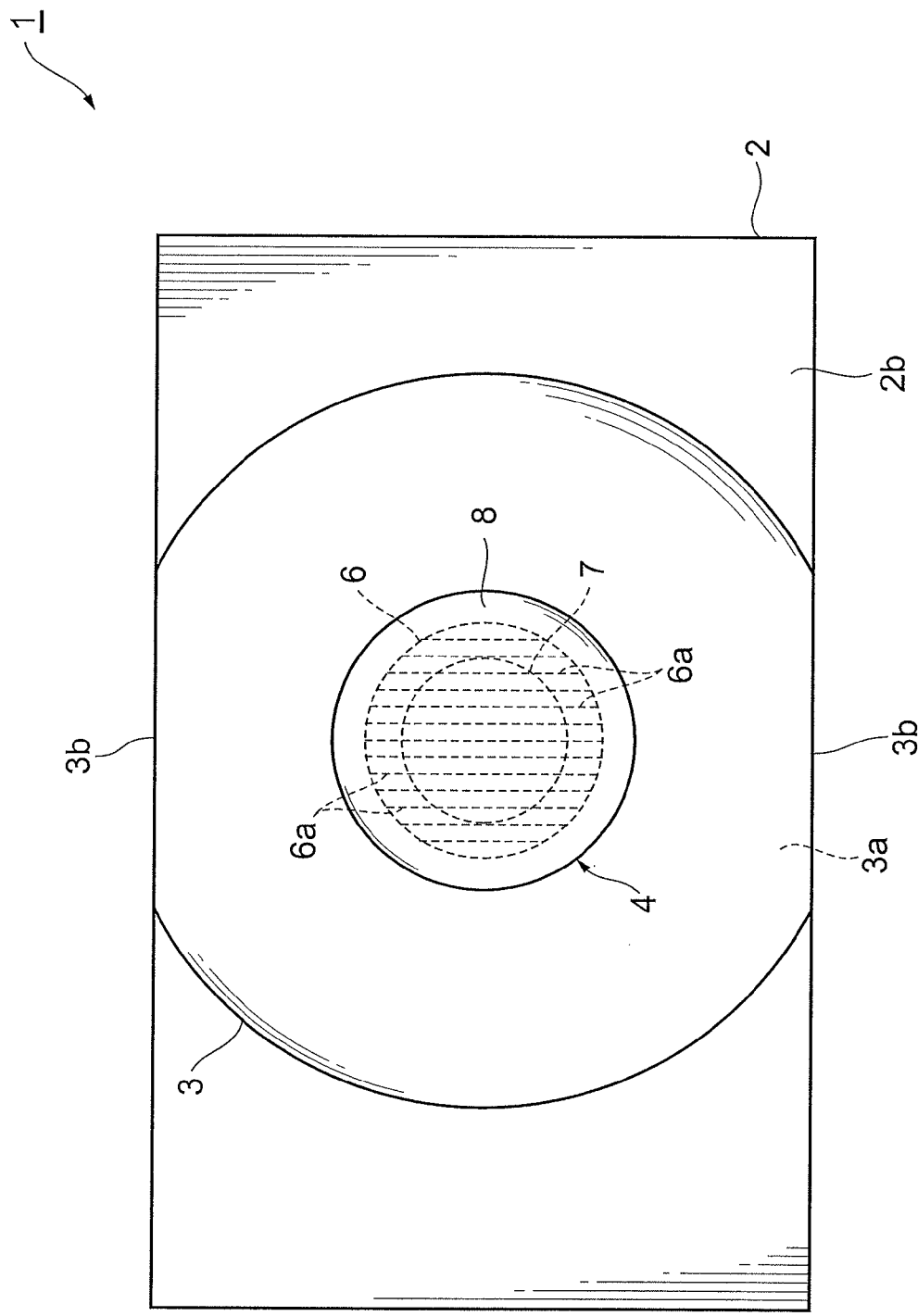
FIG. 3 is a bottom face view of the spectral module.

As illustrated in FIGS. 2 and 3, the lens unit 3 is formed from the same material as that of the substrate 2, a light transmitting resin, a light transmitting inorganic/organic hybrid material, a light transmitting low-melting glass material for forming a replica, a plastic, or the like into such a form that a semispherical lens is cut off by two planes substantially parallel to each other and substantially orthogonal to its entrance surface (bottom face) 3a so as to form side faces 3b (e.g., with a radius of curvature of 6 to 10 mm, a height of 5 to 8 mm, and the entrance surface 3a having a full length of 12 to 18 mm and a full width (distance between the side faces 3b) of 6 to 10 mm, and functions as a lens focusing the light L2 spectrally resolved by the spectroscopic unit 4 onto the light detection unit 5b of the photodetector 5. The lens form may be either spherical or aspherical.

The spectroscopic unit 4 is a reflection-type grating having a diffraction layer 6 formed on the outer surface of the lens unit 3, a reflecting layer 7 formed on the outer surface of the diffraction layer 6, and a passivation layer 8 covering the diffraction layer 6 and reflecting layer 7. The diffraction layer 6 is formed by arranging a plurality of grating grooves 6a in a row along the longitudinal direction of the substrate 2, while the extending direction of the grating groves 6a substantially coincides with a direction substantially orthogonal to the longitudinal direction of the substrate 2. The diffraction layer 6, which employs sawtooth blazed gratings, rectangular binary gratings, or sinusoidal holographic gratings, for example, is formed by photocuring an optical resin for a replica such as a photocurable epoxy, acrylic, or organic/inorganic hybrid resin. The reflecting layer 7, which is shaped like a film, is formed by vapor-depositing Al, Au, or the like onto the outer surface of the diffraction layer 6, for example. Regulating the area by which the reflecting layer 7 is formed can adjust the optical NA of the spectral module 1. The lens unit 3 and the diffraction layer 6 constituting the spectroscopic unit 4 can be formed integrally by the materials mentioned above. The passivation layer 8, which is shaped like a film, is formed by vapor-depositing $MgF_2$, $SiO_2$, or the like onto the outer surfaces of the diffraction layer 6 and reflecting layer 7, for example.

Figure 4:
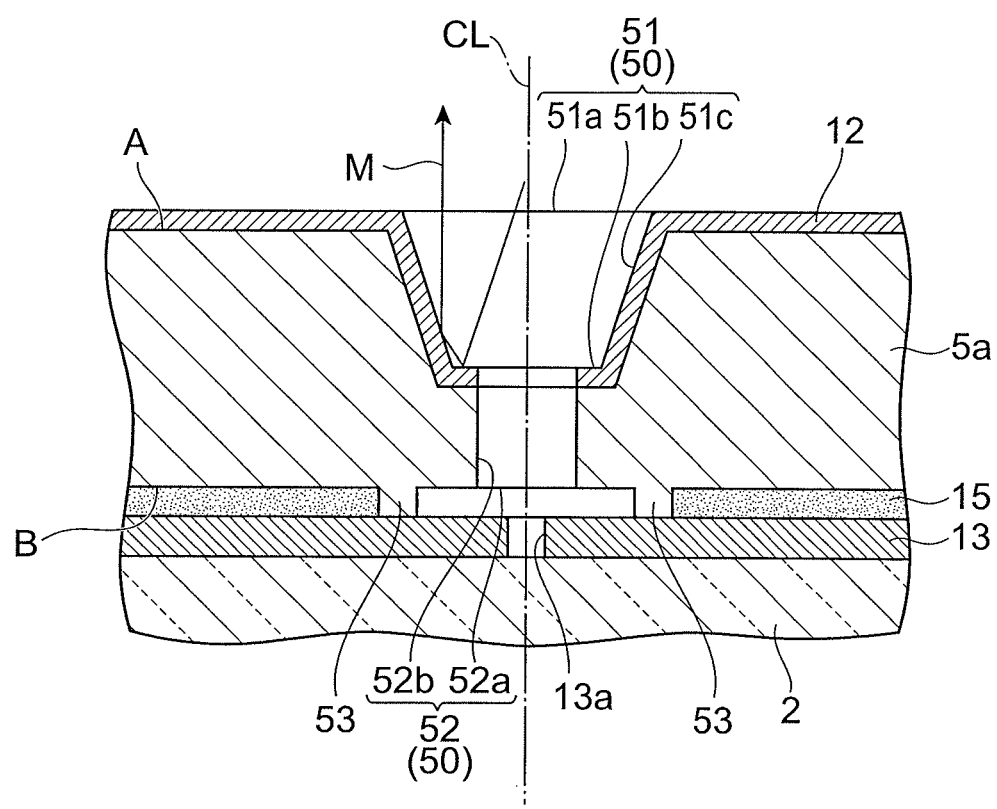
FIG. 4 is an enlarged sectional view of a main part illustrating a light transmitting hole.

As illustrated in FIGS. 1, 2, and 4, the photodetector 5 has a rectangular semiconductor substrate 5a (substrate unit) (e.g., with a full length of 5 to 10 mm, a full width of 1.5 to 3 mm, and a thickness of 0.1 to 0.8 mm) arranged on the front face 2a of the substrate 2. The semiconductor substrate 5a is made of a crystalline material such as Si, GaAs, InGaAs, Ge, or SiGe.

The light detection unit 5b is formed on the surface of the semiconductor substrate 5a on the spectroscopic unit 4 side. The light detection unit 5b is a CCD image sensor, a PD array, a CMOS image sensor, or the like, in which a plurality of channels are arranged in a row along a direction substantially orthogonal to the extending direction of the grating grooves 6a in the spectroscopic unit 4 (i.e., along the arranging direction of the grating grooves 6a). A light shielding layer 12 constituted by Al, Au, or the like is formed by vapor deposition on the surface of the semiconductor substrate 5a opposite to the spectroscopic unit 4.

When the light detection unit 5b is a CCD image sensor, the intensity information of light at its incident position on two-dimensionally arranged pixels is subjected to line binning, so as to yield light intensity information at one-dimensional positions, and the intensity information at the one-dimensional positions is read in time series. That is, a line of pixels subjected to line binning forms one channel. In the case where the light detection unit 21 is a PD array or CMOS sensor, intensity information of light at its incident position on one-dimensionally arranged pixels is read in time series, whereby one pixel forms one channel.

When the light detection unit 5b is a PD array or CMOS image sensor in which pixels are arranged two-dimensionally, a line of pixels aligning in a one-dimensional arrangement direction parallel to the extending direction of the grating grooves 6a of the spectroscopic unit 4 forms one channel. When the light detection unit 5b is a CCD image sensor, one having a channel interval in the arrangement direction of 12.5 μm, a channel full length (length of the one-dimensional pixel row subjected to line binning) of 1 mm, and 256 arrangement channels, for example, is used for the photodetector 5.

Figure 5:
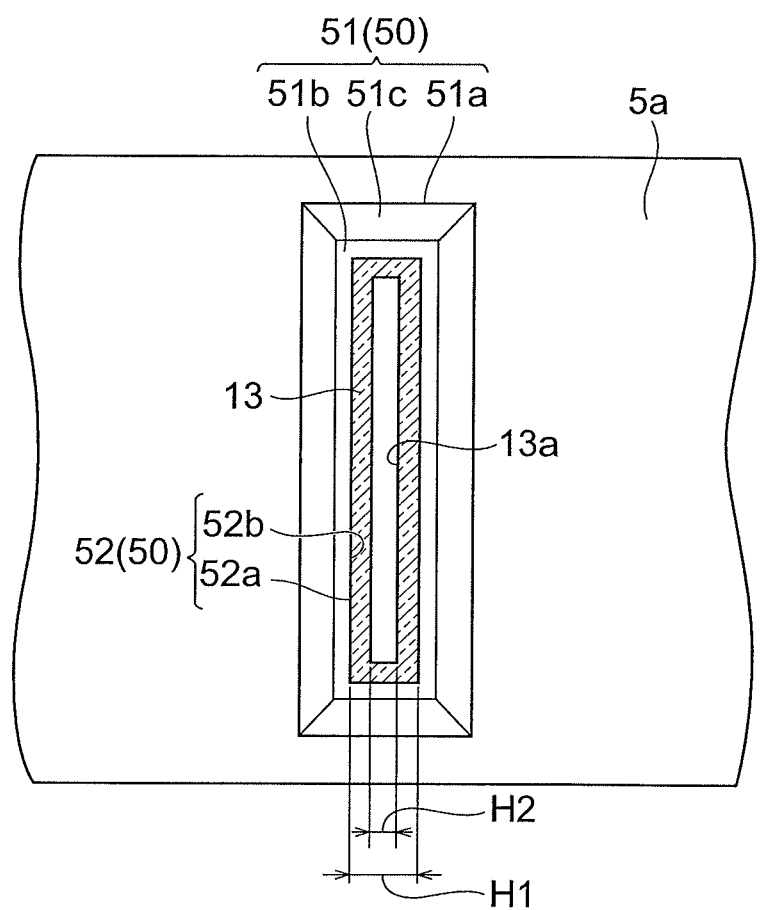
FIG. 5 is an enlarged plan view of a main part illustrating the light transmitting hole.

As illustrated in FIGS. 2, 4, and 5, the semiconductor substrate 5a is formed with a light transmitting hole 50, disposed in parallel with the light detection unit 5b in the channel arrangement direction, for transmitting the light L1 proceeding to the spectroscopic unit 4. The light transmitting hole 50, which extends in a direction substantially orthogonal to the front face 2a of the substrate 2, is formed by etching or the like while being aligned with the light detection unit 5b with high precision.

The light transmitting hole 50 is constituted by a light entrance side unit 51 defining a light entrance opening 51a through which the light L1 enters and a light exit side unit 52 defining a light exit opening 52a through which the light L1 exits. The light entrance side unit 51 is formed into a substantially truncated quadrilateral pyramid so as to become narrower toward the front face 2a of the substrate 2 and has a bottom face 51b which is substantially parallel to the front face 2a of the substrate 2.

The light exit side unit 52, which is formed into a substantially quadrangular prism from the surface of the semiconductor substrate 5a on the spectroscopic unit 4 side so as to oppose the bottom face 51b of the light entrance side unit 51 and connect therewith, has a side face 52b substantially perpendicular to the front face 2a of the substrate 2. The light exit side unit 52 is formed such that its width H1 (minimal width) is greater than the width H2 of the slit 13a of the light absorbing layer 13 in the channel arrangement direction of the light detection unit 5b (i.e., in a direction substantially orthogonal to the extending direction of the grating grooves 6a).

An underfill material 15 which transmits at least the light L2 therethrough is provided between the semiconductor substrate 5a and the substrate 2 or light absorbing layer 13. The surface of the semiconductor substrate 5a on the substrate 2 side is formed with a rectangular ring-shaped projection 53 which surrounds the light exit opening 52a, whereby the provided underfill material 15 is blocked by the projection 53 before reaching the light exit opening 52a. This prevents the underfill material 15 from entering the light transmitting hole 50, whereby light can enter the main unit 2 without being refracted or dispersed by the underfill material 15. External terminals of the photodetector 5 are electrically connected by wire-bonding through bumps 14 to the pad units 11a exposed from the light absorbing layer 13. The pad units 11b are electrically connected to external electric devices (not depicted).

A method for manufacturing the above-mentioned spectral module 1 will now be explained.

First, the photodetector 5 is prepared. For example, the semiconductor substrate 5a constituted by Si is subjected to alkali etching using KOH (potassium hydroxide), TMAH (tetramethylammonium hydroxide), or the like, so as to form the rectangular ring-shaped projection 53 surrounding the scheduled light exit opening 52a. Thereafter, the light detection unit 5b, wiring, and electrode pads are prepared on the other main face B side.

Figure 6:
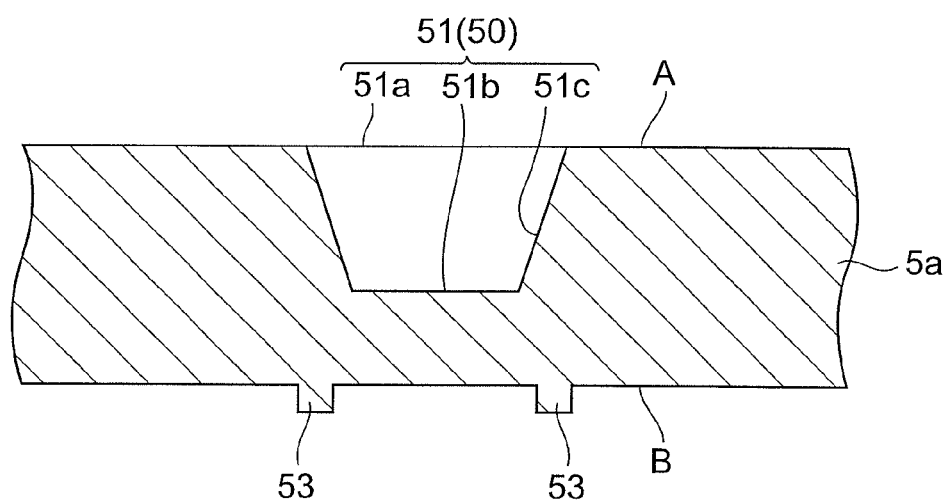
FIG. 6 is a sectional view for explaining a step of forming a light entrance side unit.
Figure 7:
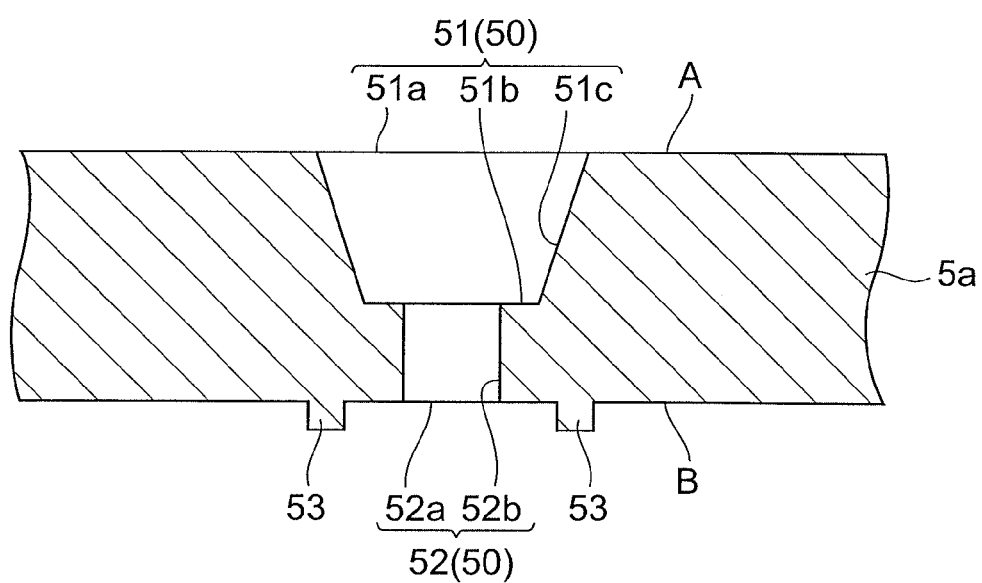
FIG. 7 is a sectional view for explaining a step of forming a light exit side unit.

Subsequently, a mask is opened at a predetermined position by photolithography using double-sided alignment with reference to the light detection unit 5b, and alkali etching is carried out, so as to form the light entrance side unit 51 shaped into a substantially truncated quadrilateral pyramid (see FIG. 6). Here, by alkali etching, the semiconductor substrate 5a constituted by Si, for example, is formed with a side face 51c of the light entrance side unit 51 along a (111) crystal plane which is tilted by about 55° with respect to a (100) crystal plane. Then, by photolithography with reference to the light detection unit 5b, the other main face B of the semiconductor substrate 5a is subjected to silicon deep dry etching using plasma discharge at a predetermined position, so as to form the light exit side unit 52 shaped into a substantially quadrangular prism opposing the bottom face 51b of the light entrance side unit 51 (see FIG. 7). Thus, the light transmitting hole 50 extending in a direction substantially orthogonal to one main face A of the semiconductor substrate 5a is formed. Thereafter, the light shielding layer 12 is formed by vapor-depositing Al, Au, or the like onto one main face A and the side face 51c and bottom face 51b of the light entrance side unit 51, and the wafer is diced with reference to the light detection unit 5b, so as to prepare the photodetector 5.

Next, the lens unit 3 is formed with the spectroscopic unit 4. Specifically, a light transmitting master grating inscribed with gratings corresponding to the diffraction layer 6 is pressed against an optical resin for a replica dripped near the vertex of the lens unit 3. The optical resin for a replica is cured by irradiation with light in this state, and then preferably cured by heating for stabilization, so as to form the diffraction layer 6 having a plurality of grating grooves 6a. Thereafter, the master grating is released, Al, Au, or the like is vapor-deposited onto the outer surface of the diffraction layer 6 wholly or through a mask, so as to form the reflecting layer 7, and MgF$_2$, SiO$_2$, or the like is further vapor-deposited onto the outer surfaces of the diffraction layer 6 and reflecting layer 7, so as to form the passivation layer 8.

On the other hand, the substrate 2 is prepared, and the light absorbing layer 13 having the slit 13a and opening 13b is formed on the front face 2a of the substrate 2. Here, the slit 13a and opening 13b are formed such as to have a predetermined positional relationship with respect to an outer edge portion of the substrate 2 serving as a reference for positioning the spectroscopic unit 4 on the substrate 2.

The photodetector 5 is mounted on the light absorbing layer 13 by face-down bonding. Subsequently, the underfill material 15 is provided between the photodetector 5 and the front face 2a of the substrate 2. Thereafter, with reference to the outer edge portion of the substrate 2, the lens unit 3 formed with the spectroscopic unit 4 is bonded to the rear face 2b of the substrate 2 with an optical resin agent 18, so as to yield the spectral module 1. Here, the photodetector 5 and the substrate 2 are electrically connected to each other through the bumps 14.

Operations and effects of the above-mentioned spectral module 1 will now be explained.

When the light L1 proceeding to the spectroscopic unit 4 passes through the light transmitting hole 50 in the spectral module 1, only the light having entered the light exit side unit 52 formed such as to oppose the bottom face 51b of the light entrance side unit 51 becoming narrower toward the substrate 2 is emitted from the light exit opening 52a. Here, stray light M incident on the bottom face 51b or side face 51c of the light entrance side unit 51 is reflected toward the light entrance opening 51a, and thus is inhibited from entering the light exit side unit 52. This can improve the reliability of the spectral module 1.

In this spectral module 1, subjecting the semiconductor substrate 5a in a wafer state to alkali etching can collectively form the light entrance side unit 51, thereby reducing the time and cost in the step of preparing the photodetector 5.

Carrying out silicon deep dry etching from the other main face B of the semiconductor substrate 5a can accurately form the light exit side unit 52, so as to produce the light transmitting hole 50 having a stable light transmitting characteristic, thereby improving the reliability of the spectral module 1. Specifically, since the light exit side unit 52 is formed from the other main face B side where the light detection unit 5b is arranged, the positional accuracy of the light exit side unit 52 with respect to the light detection unit 5b on the same plane can be raised in the spectral module 1. Since the light passing through the light exit side unit 52 of the light transmitting hole 50 is diffracted and reflected by the grating grooves 6a of the spectroscopic unit 4 and detected by the light detection unit 5b, the reliability of the spectral module 1 can be improved when the positional accuracy between the light exit side unit 52 and the light detection unit 5b is raised. Further, the form of the opening cross section of the light exit side unit 52 (i.e., the form of the light exit opening 52a) is optically focused at the light detection unit 5b, while the channel of the light detection unit 5b is arranged so as to correspond to the minimal width of the light exit side unit 52 in the longitudinal direction of the semiconductor substrate 5a. Therefore, the resolution of the spectral module 1 is greatly influenced by the minimal width of the light exit side unit 52 in the channel arrangement direction. Hence, accurately forming the light exit side unit 52 by silicon deep dry etching can inhibit the resolution from fluctuating among products and improve the reliability of the spectral module 1.

In this spectral module 1, the semiconductor substrate 5a is constituted by a crystalline material such as Si, so that the light entrance side section 51 can be formed accurately when a side face is formed along a (111) crystal plane of the material by alkali etching, whereby the light transmitting hole 50 can be formed with high precision. Therefore, the reliability of the spectral module 1 can be improved.

In a direction substantially orthogonal to the extending direction of the grating grooves 6a, the resolution of the spectral module 1 is greatly influenced by the minimal width of a slit through which light passes. Therefore, making the width H2 of the slit 13a in the light absorbing layer 13 smaller than the minimum width H1 of the light transmitting hole 50 in the photodetector 5 in a direction substantially orthogonal to the extending direction of the grating grooves 6a can improve the resolution of the spectral module 1. This is advantageous in improving the reliability of the spectral module 1.

Figure 8:
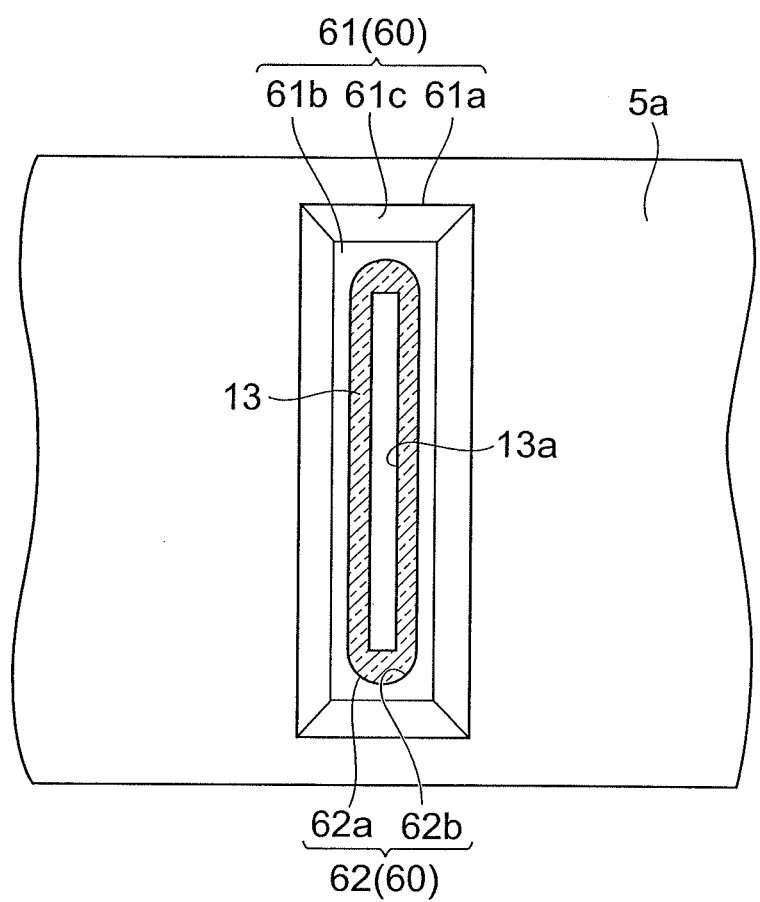
FIG. 8 is an enlarged plan view of a main part illustrating a modified example of the light transmitting hole and corresponding to FIG. 5.
Figure 9:
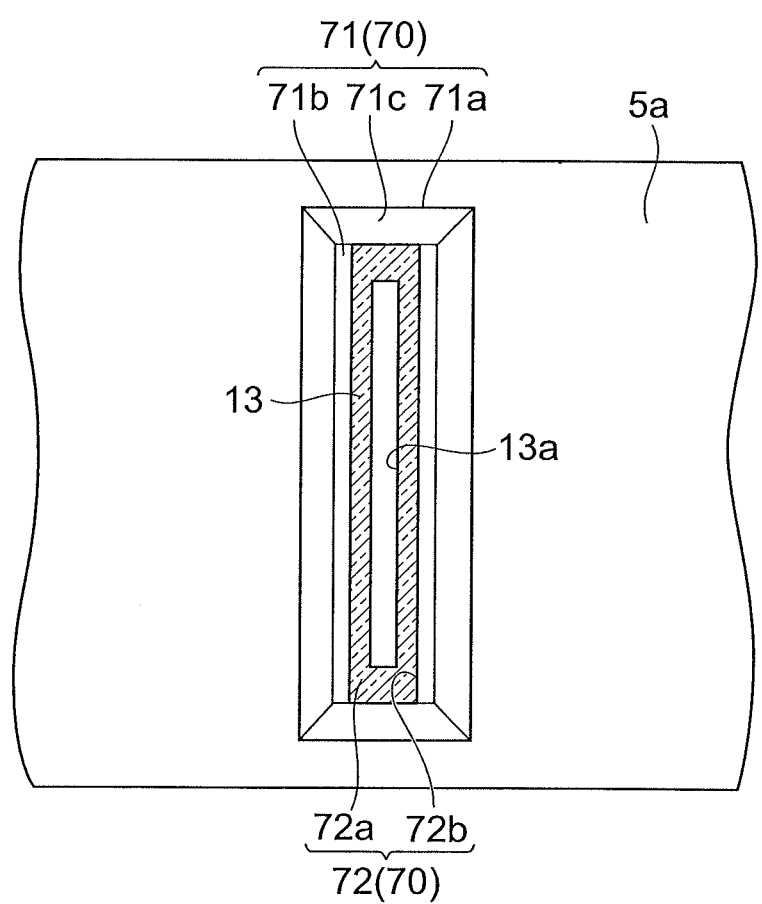
FIG. 9 is an enlarged plan view of a main part illustrating a modified example of the light transmitting hole and corresponding to FIG. 5.
Figure 10:
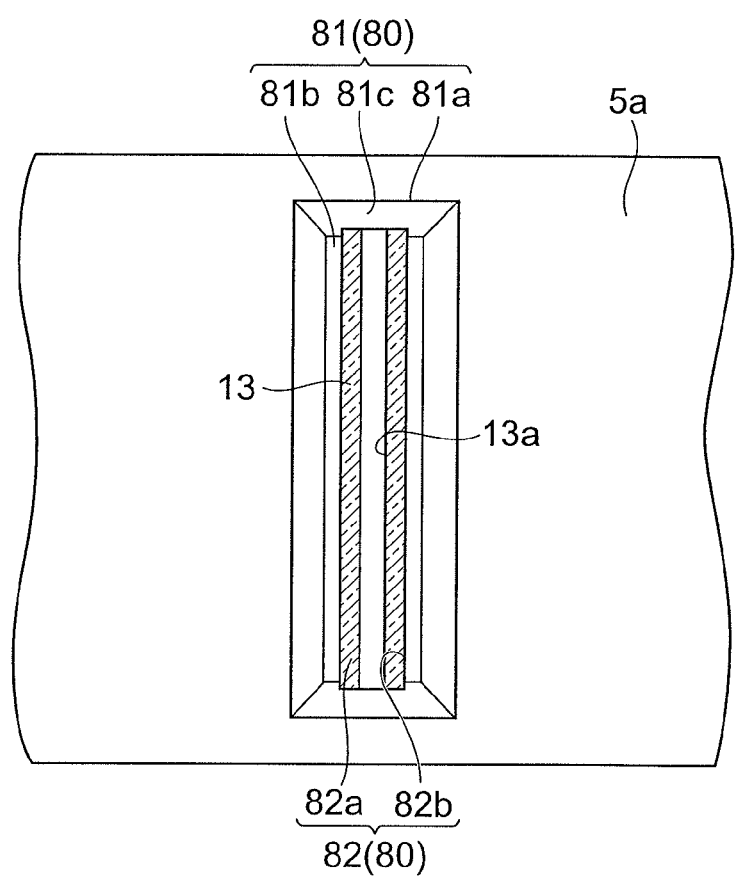
FIG. 10 is an enlarged plan view of a main part illustrating a modified example of the light transmitting hole and corresponding to FIG. 5.

As illustrated in FIG. 8, in a light transmitting hole 60 formed in the photodetector 5, a light exit side unit 62 having a side face 62b substantially perpendicular to a bottom face 61b of a light entrance side unit 61 may be formed with an oblong cross section. As illustrated in FIG. 9, a light exit side unit 72 may be made longer than that in FIG. 5 in a direction substantially orthogonal to the longitudinal direction (i.e., in the extending direction of the grating grooves 6a), so that the width of a bottom face 71b of a light entrance side unit 71 and the width of the opening cross section of the light exit side unit 72 equal each other, i.e., the side face 72b of the light exit side unit 72 and the side face 71c of the light entrance side unit 71 are directly joined together. As illustrated in FIG. 10, a light exit side unit 82 may be made further longer than that in FIG. 9, so that the width of the opening cross section in the light exit side unit 82 is greater than the width of a bottom face 81b of a light entrance side unit 81 in a direction substantially orthogonal to the longitudinal direction of the semiconductor substrate 5a.

Second Embodiment

A spectral module 21 in accordance with the second embodiment differs from the spectral module 1 in accordance with the first embodiment in the structure of the photodetector and in that a wiring board is arranged on the front face of the substrate.

Figure 11:
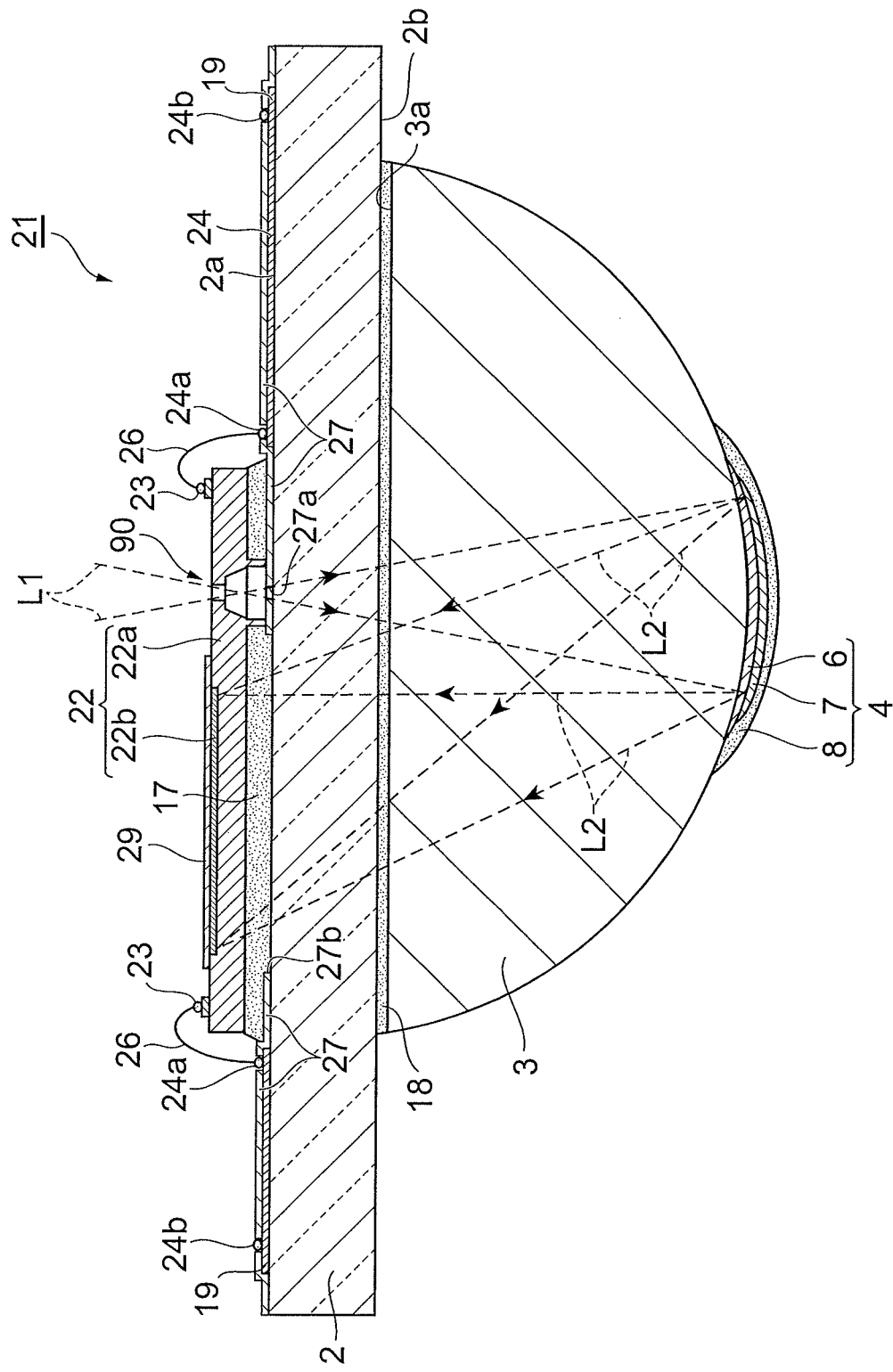
FIG. 11 is a sectional view illustrating the spectral module in accordance with a second embodiment and corresponding to FIG. 2.
Figure 12:
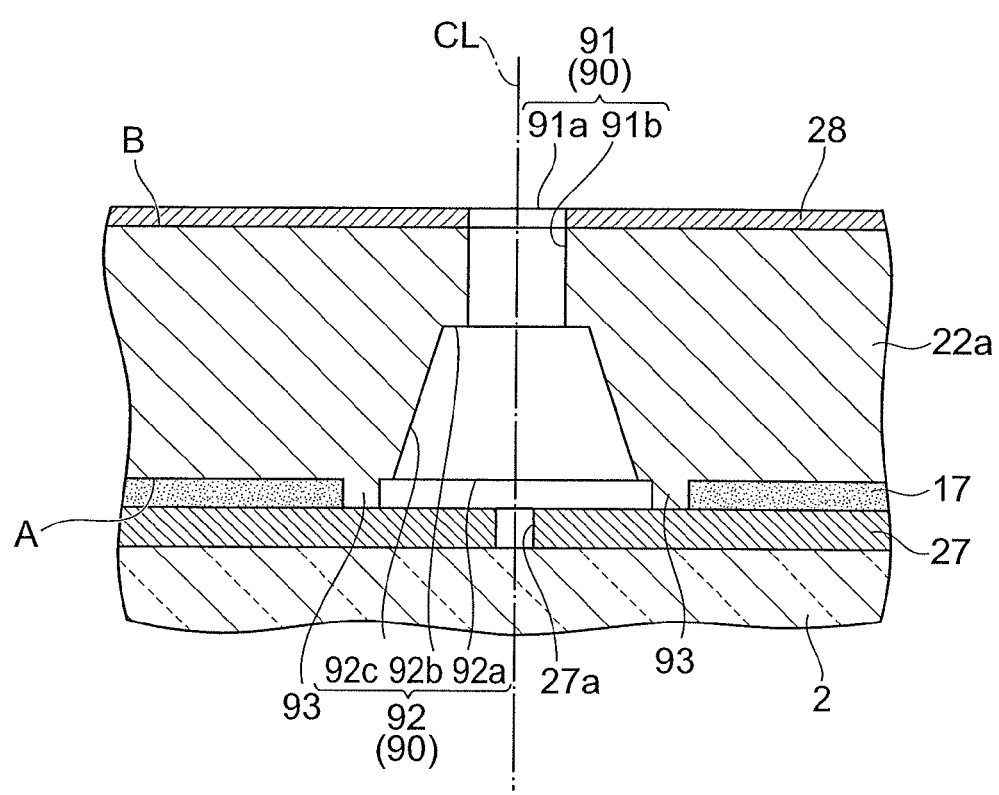
FIG. 12 is a sectional view illustrating the light transmitting hole in accordance with the second embodiment and corresponding to FIG. 3.

In the spectral module 21, as illustrated in FIGS. 11 and 12, a plurality of terminal electrodes 23 are formed on a surface of the photodetector 22 on the side opposite to the spectroscopic unit 4. The terminal electrodes 23 are connected to their corresponding pad units 24 of a wiring board 24 with wires 26. This electrically connects the terminal electrodes 23 to the wiring board 24, whereby an electric signal generated in a light detection unit 22b is taken out through the terminal electrodes 23 and pad units 24a and 24b of the wiring board 24.

A light transmitting hole 90 formed in the semiconductor substrate 22a is constituted by a light entrance side unit 91 defining a light entrance opening 91a and a light exit side unit 92 defining a light exit opening 92a. The light entrance side unit 91 has a side face 91b substantially perpendicular to the front face 2a of the substrate 2. The light exit side unit 92 is formed into a substantially truncated quadrilateral pyramid so as to become wider toward the front face 2a of the substrate 2 and has an upper face 92a which is substantially parallel to the front face 2a of the substrate 2. The light entrance side unit 91 is formed into a substantially quadrangular prism opposing the upper face 92b of the light exit side unit 92, while its side face 91b is joined to the upper face 92b of the light exit side unit 92. A light absorbing layer 27 formed on the front face 2a of the substrate 2 has a slit (light transmitting slit) 27a which is narrower than the minimal width of the light entrance side unit 91 in a direction substantially orthogonal to the extending direction of the grating grooves 6a of the spectroscopic unit 4.

A method for manufacturing the above-mentioned spectral module 21 will now be explained.

First, the photodetector 22 is prepared. For example, on a semiconductor substrate 22a in a wafer state constituted by Si, the light detection unit 22, wiring, and electrode pads are prepared on the other main face B side. Thereafter, Al, Au, or the like is vapor-deposited on an insulating film such as $SiO_2$ on the other main face B, so as to form a light shielding layer 29, thereby preparing the photodetector 22.

Subsequently, alkali etching using KOH (potassium hydroxide), TMAH (tetramethylammonium hydroxide), or the like, dry etching, and the like are carried out, so as to form a rectangular ring-shaped projection 93 surrounding the scheduled light exit opening 92a. Thereafter, on one main face A of the semiconductor substrate 22a, a mask is opened at a predetermined position by photolithography using double-sided alignment with reference to the light detection unit 22b, and alkali etching using KOH (potassium hydroxide) or TMAH (tetramethylammonium hydroxide) is carried out, so as to form the light entrance side unit 92 shaped into a substantially truncated quadrilateral pyramid. Then, the other main face B of the semiconductor substrate 22a is subjected to silicon deep dry etching using plasma discharge at a predetermined position, so as to form the light entrance side unit 91 shaped into a substantially quadrangular prism joined to the bottom face 92b of the light exit side unit 92. Thus, the light transmitting hole 90 extending in a direction substantially orthogonal to one main face A of the semiconductor substrate 5a is formed. Thereafter, the light shielding layer 29 is formed by vapor-depositing Al, Au, or the like onto one main face A and the side face 91c and bottom face 91b of the light entrance side unit 91, and the wafer is diced with reference to the light detection unit 22b, so as to prepare the photodetector 22.

Subsequently, with reference to outer edge portions of the photodetector 22 and substrate 2 or alignment marks, the other main face B side of the photodetector 22 is bonded to the front face 2a of the substrate 2 with an optical resin material 17. Thereafter, the terminal electrodes 23 of the photodetector 22 are connected to their corresponding pad units 24a of the substrate 2 with the wires 26. The pad units 24a are electrically connected to their corresponding terminal pad units 24b through a wiring layer 19. A light absorbing layer made of a black resist or the like is arranged at an outer peripheral portion of the photodetector 22 in the substrate 2 and thus can absorb disturbance light and reflected light which is unnecessary as a signal from the spectroscopic unit 4, thereby securing the reliability.

The lens unit 3 formed with the spectroscopic unit 4 is bonded to the rear face 2b of the substrate 2 with the optical resin agent 18 with reference to the outer edge portion of the substrate 2, so as to yield the spectral module 21.

By collectively forming the light exit side unit 92 by subjecting the semiconductor substrate 22a in a wafer state to alkali etching, the above-mentioned spectral module 21 in accordance with the second embodiment can reduce the time and cost in the step of preparing the photodetector 22. Carrying out silicon deep dry etching from the other main face B of the semiconductor substrate 5a can accurately form the light exit side unit 52, so as to produce the light transmitting hole 50 having a stable light transmitting characteristic, thereby improving the reliability of the spectral module 1.

The present invention is not limited to the above-mentioned embodiments.

For example, the form of the light entrance side unit in the first embodiment and the light exit side unit in the second embodiment is not limited to the substantially truncated quadrilateral pyramid as long as it has a bottom face (upper face) substantially parallel to the front face 2a of the substrate 2 and becomes narrower toward the front face 2a of the substrate 2. Similarly, the form of the light exit side unit in the first embodiment and the light entrance side unit in the second embodiment is not limited to the substantially quadrangular prism as long as it has a side face substantially perpendicular to the front face 2a of the substrate 2 and opposes the bottom face (upper face) of the light entrance side unit (light exit side unit) paired therewith.

The light transmitting hole is not limited to the mode in which the light entrance side unit and the light exit side unit are directly joined together, but may be provided with an intermediate unit (e.g., a part having a different angle of inclination of the side face or a different opening cross-sectional form).

The light entrance side unit in the first embodiment and the light exit side unit in the second embodiment may be formed not only by alkali etching, but also by various kinds of wet etching and dry etching. Similarly, the light exit side unit in the first embodiment and the light entrance side unit in the second embodiment may be formed not only by silicon deep dry etching but also by various kinds of dry etching.

The above-mentioned first embodiment may employ the structure of the light transmitting hole in the second embodiment, while the second embodiment may employ the structure of the light transmitting hole in the first embodiment.

INDUSTRIAL APPLICABILITY

The present invention can provide a highly reliable spectral module.

REFERENCE SIGNS LIST 1, 21 . . . spectral module; 2 . . . substrate (main unit); 2a . . . front face (predetermined surface); 3 . . . lens unit (main unit); 4 . . . spectroscopic unit; 5, 22 . . . photodetector; 5a, 22a . . . semiconductor substrate; 5b, 22b . . . light detection unit; 6 . . . diffraction layer; 6a . . . grating groove; 13, 27 . . . light absorbing layer; 50, 60, 70, 80, 90 . . . light transmitting hole; 51, 61, 71, 81, 91 . . . light entrance side unit; 52, 62, 72, 82, 92 . . . light exit side unit; 51a, 61a, 71a, 81a, 91a . . . light entrance opening; 51b, 61b, 71b, 81b . . . bottom face; 51c, 61c, 71c, 81c, 92c . . . side face; 52a, 62a, 72a, 82a, 92a . . . light exit opening; 92b . . . upper face (bottom face); 52b, 62b, 72b, 82b, 91b . . . side face; A . . . one main face; B . . . the other main face

The invention claimed is:
1. A spectral module comprising:
a main unit for transmitting light therethrough;
a spectroscopic unit for spectrally resolving light having entered the main unit from a predetermined surface side of the main unit and reflecting the light toward the predetermined surface; and
a photodetector, arranged on the predetermined surface, for detecting the light spectrally resolved by the spectroscopic unit;

wherein the photodetector has a substrate unit formed with a light transmitting hole for transmitting therethrough light proceeding to the spectroscopic unit;

wherein the light transmitting hole includes a light entrance side unit defining a light entrance opening and a light exit side unit defining a light exit opening;

wherein the light entrance side unit is formed such as to have a bottom face substantially parallel to the predetermined surface and become narrower toward the predetermined surface; and wherein the light exit side unit is formed such as to have a side face substantially perpendicular to the predetermined surface and oppose the bottom face.

2. A spectral module according to claim 1, wherein a light absorbing layer for absorbing light is formed between the photodetector and the predetermined surface;

wherein the light absorbing layer has a light transmitting slit for transmitting therethrough light proceeding to the spectroscopic unit through the light transmitting hole; and wherein the light transmitting slit has a width smaller than the minimal width of the light exit side unit in a direction substantially orthogonal to an extending direction of a grating groove formed in the spectroscopic unit.

3. A spectral module according to claim 1, wherein the substrate unit is made of a crystalline material; and wherein a side face of the light entrance side unit is formed along a (111) crystal plane.

4. A method for manufacturing a spectral module comprising a main unit for transmitting light therethrough, a spectroscopic unit for spectrally resolving light having entered the main unit from a predetermined surface side of the main unit and reflecting the light toward the predetermined surface, and a photodetector for detecting the light spectrally resolved by the spectroscopic unit, the method comprising:

a photodetector preparation step of preparing the photodetector having a substrate unit formed with a light transmitting hole; and an arrangement step of arranging the photodetector prepared in the photodetector and the spectroscopic unit onto the main unit;

wherein the photodetector preparation step includes:

a light entrance side unit formation step of carrying out wet etching from one main face side of the substrate unit so as to form a light entrance side unit for defining a light entrance opening of the light transmitting hole such that the light entrance side unit has a bottom face substantially parallel to the one main face and becomes narrower toward the other main face; and a light exit side unit formation step of carrying out dry etching from the other main face side of the substrate unit after the light entrance side unit formation step so as to form a light exit side unit for defining a light exit opening of the light transmitting hole such that the light exit side unit has a side face substantially perpendicular to the one main face and opposes the bottom face.

* * * * *

UNITED STATES PATENT AND TRADEMARK OFFICE
CERTIFICATE OF CORRECTION

PATENT NO. : 8,604,412 B2  Page 1 of 1
APPLICATION NO. : 12/992473
DATED : December 10, 2013
INVENTOR(S) : Shibayama et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 440 days.

Signed and Sealed this
Twenty-second Day of September, 2015

Michelle K. Lee
*Director of the United States Patent and Trademark Office*